United States Patent
Wang et al.

(10) Patent No.: US 11,258,038 B2
(45) Date of Patent: Feb. 22, 2022

(54) FLEXIBLE ORGANIC LIGHT-EMITTING DIODE (OLED) DEVICE OF REDUCED STESS AT BENDING PLACE AND FABRICATION METHOD THEREOF

(71) Applicant: Wuhan China Star Optoelectronics Semiconductor Display Technology Co., Ltd., Wuhan (CN)

(72) Inventors: Yijia Wang, Wuhan (CN); Kan Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 271 days.

(21) Appl. No.: 16/495,277

(22) PCT Filed: Apr. 16, 2019

(86) PCT No.: PCT/CN2019/082802
§ 371 (c)(1),
(2) Date: Sep. 18, 2019

(87) PCT Pub. No.: WO2020/155404
PCT Pub. Date: Aug. 6, 2020

(65) Prior Publication Data
US 2021/0336206 A1    Oct. 28, 2021

(30) Foreign Application Priority Data

Jan. 30, 2019  (CN) .......................... 201910093582.5

(51) Int. Cl.
*H01L 29/08* (2006.01)
*H01L 51/52* (2006.01)
*H01L 51/56* (2006.01)

(52) U.S. Cl.
CPC .......... *H01L 51/5253* (2013.01); *H01L 51/56* (2013.01); *H01L 2251/5338* (2013.01)

(58) Field of Classification Search
CPC ................................................. H01L 51/5253
See application file for complete search history.

(56) References Cited

U.S. PATENT DOCUMENTS

2006/0250084 A1* 11/2006 Cok .................... H01L 51/5253
                                                        313/512
2014/0152174 A1*  6/2014 Wang ................. H01L 51/5253
                                                        313/511

(Continued)

*Primary Examiner* — Caleb E Henry

(57) ABSTRACT

The present disclosure provides a flexible organic light-emitting diode (OLED) device and a fabrication method thereof, wherein the flexible organic light emitting diode (OLED) device includes a substrate, an array unit layer, a light-emitting device layer, and an encapsulation layer that are sequentially disposed. The encapsulation layer includes a first inorganic layer, a first organic layer and a second inorganic layer that are sequentially disposed. The second inorganic layer has a continuous wavy curved-configuration, and an interface between the second inorganic layer and the first organic layer has a continuous wavy curved-shape. The present disclosure is directed to a flexible OLED device using a novel outer inorganic layer to increase the contact area between the outer inorganic layer and the inner organic layer, thereby effectively reducing risks of breakage of the outer inorganic layer.

9 Claims, 1 Drawing Sheet

(56) References Cited

U.S. PATENT DOCUMENTS

| | | | |
|---|---|---|---|
| 2015/0228927 A1* | 8/2015 | Kim | H01L 51/5203 257/40 |
| 2016/0062520 A1* | 3/2016 | Choi | G06F 3/0443 345/174 |
| 2016/0095172 A1* | 3/2016 | Lee | C23C 16/401 313/504 |
| 2016/0233447 A1* | 8/2016 | Kim | H01L 51/0094 |
| 2017/0018737 A1* | 1/2017 | Kim | H01L 27/3244 |
| 2017/0133630 A1* | 5/2017 | Kim | H01L 51/5246 |
| 2017/0155086 A1* | 6/2017 | Kang | H01L 27/3262 |
| 2017/0214000 A1* | 7/2017 | Li | H01L 51/0097 |
| 2017/0227819 A1* | 8/2017 | Fan | G02F 1/133514 |
| 2018/0151833 A1* | 5/2018 | Riegel | H01L 51/5253 |
| 2019/0051862 A1* | 2/2019 | Peng | H01L 51/524 |
| 2019/0067638 A1* | 2/2019 | Huang | H01L 51/5256 |
| 2019/0088901 A1* | 3/2019 | Yu | H01L 51/5237 |
| 2019/0131567 A1* | 5/2019 | Li | H01L 51/56 |
| 2019/0148476 A1* | 5/2019 | Park | G09G 3/3291 257/40 |
| 2019/0393278 A1* | 12/2019 | Wu | H01L 27/323 |
| 2020/0083478 A1* | 3/2020 | Ochi | H01L 51/5253 |
| 2020/0235330 A1* | 7/2020 | Chen | H01L 21/02118 |
| 2020/0235336 A1* | 7/2020 | Qian | H01L 27/3244 |

* cited by examiner

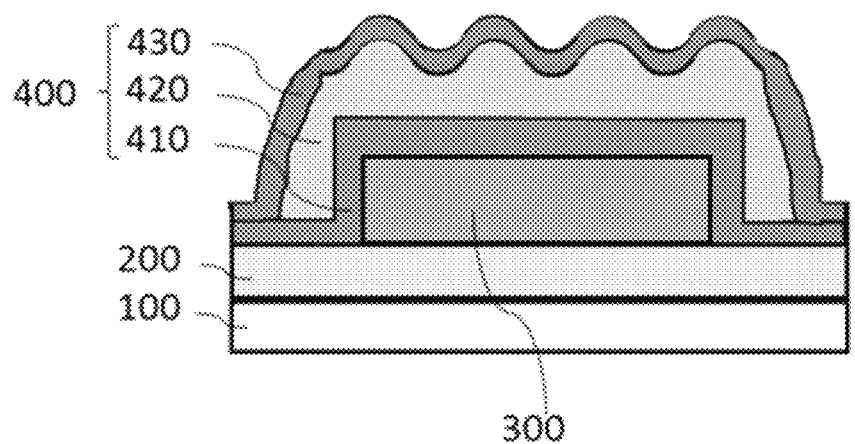

FLEXIBLE ORGANIC LIGHT-EMITTING DIODE (OLED) DEVICE OF REDUCED STESS AT BENDING PLACE AND FABRICATION METHOD THEREOF

FIELD OF INVENTION

The present application relates to light-emitting display technologies, and more particularly to a flexible organic light-emitting diode (OLED) device and fabrication method thereof.

BACKGROUND

It is known that flexible organic light emitting diode (OLED) display devices have properties such as low power consumption, high resolution, fast response times, and being bendable, so that it become a popular trend of development in the display industry and gradually become the mainstream in the industry.

In the light emitting unit of the OLED display device, the organic layer in the outer encapsulation layer is particularly sensitive to moisture and oxygen in the surrounding, and needs to be protected by more strict encapsulation conditions to prevent moisture and oxygen in the surrounding from passing through the encapsulation layer and enters the OLED display device.

Furthermore, in order to realize the bendable properties of the flexible OLED display panel, the substrate of the display panel is normally made of a flexible material such as polyimide (PI) or polyester (PET), and a thin film transistor (TFT), an OLED device, and a thin film encapsulation (TFE) are then sequentially fabricated thereon.

The commonly used thin film encapsulation method is formed by a three-layer film comprising inorganic/organic/inorganic films, such as those disclosed in U.S. Pat. No. 9,419,247, wherein the function of the inorganic layers are mainly to block the intrusion of external moisture and oxygen, and the function of the organic layer is mainly to cover the particles generated during the front-end processes and to relieve the stress generated when the films are bent.

While the above three-layer film encapsulation structure is subjected to a bending test, since the outermost inorganic film layer is located at the outermost layer of the encapsulation structure, it is subjected to the maximum bending stress, and cracking risk exists in this film layer due to its material properties, and causes failure to the entire encapsulation structure as once it breaks due to the bending stress.

Therefore, there is a need to develop a novel flexible OLED device to overcome the drawbacks of the related art.

SUMMARY

One aspect of the present invention is to provide a flexible OLED device, and it uses a novel outer inorganic layer configuration having increased contact area between the outer inorganic layer and the inner organic layer, so that of the risk of breakage of the inorganic layer is reduced.

The technical solutions of the present application are:

A flexible organic light emitting diode (OLED) device, comprising a substrate, an array unit layer, a light-emitting device layer, and an encapsulation layer that are sequentially disposed, wherein the encapsulation layer comprises a first inorganic layer, a first organic layer, and a second inorganic layer that are sequentially disposed. The first inorganic layer encapsulates the light emitting device layer and connects the array unit layer at two ends thereof, the first organic layer is disposed over the first inorganic layer to encapsulate the light emitting device layer in the same way. The second inorganic layer encapsulates the first organic layer and connects two ends of the first organic layer outside the first organic layer, and the second inorganic layer has a continuous wavy curved-configuration, and an interface between the second inorganic layer and the first organic layer has a continuous wavy curved-shape.

Furthermore, in various embodiments, a thermal stress difference exists between a film thermal stress S1 of the first organic layer and a film thermal stress S2 of the second inorganic layer, and the second inorganic layer is spontaneously formed with the curved configuration during fabrication thereof due to the existence of the thermal stress difference between the first organic layer and the second inorganic layer, thereby causing the interface between the second inorganic layer and the first organic layer is spontaneously formed with the continuous wavy curved-shape.

Furthermore, in various embodiments, the film thermal stress of the first organic layer is greater than the film thermal stress of the second inorganic layer.

Furthermore, in various embodiments, the film thermal stress S1 of the first organic layer is between −10-10 MPa.

Furthermore, in various embodiments, the film thermal stress S2 of the second inorganic layer is less than −20 MPa.

Furthermore, in various embodiments, an optically clear adhesive (OCA) layer is disposed over the second inorganic layer to level the continuous wavy curved-configuration of the second inorganic layer.

Furthermore, in various embodiments, the encapsulation layer further comprises a second organic layer and a third inorganic layer disposed over the second inorganic layer, and the third inorganic layer has a curved configuration, and an interface between the third inorganic layer and the second organic layer is a continuous wavy curved-shape.

Furthermore, in various embodiments, an optically clear adhesive (OCA) layer is disposed over the third inorganic layer to level the continuous wavy curved-configuration of the third inorganic layer.

Furthermore, in various embodiments, the first inorganic layer has a thickness of 0.1-10 μm, and materials for fabricating the same may comprise SiNx, SiOxNy, SiOx, SiCNx, AlOx, or TiOx, but are not limited thereto, and methods for fabricating the same may be processes such as plasma-enhanced chemical vapor deposition (PECVD), atomic layer deposition (ALD), pulsed laser deposition (PLD), or sputtering, but are not limited thereto.

Furthermore, in various embodiments, the first organic layer has a thickness of 1-100 μm.

Furthermore, in various embodiments, the first organic layer comprises pp-HMDSO:F polymerized by fluorinated plasma polymerization, and can be fabricated by a PECVD process Furthermore, in various embodiments, reaction gases for fabricating the first organic layer comprises at least one oxygen-containing gases such as oxygen, $N_2O$, and a silicon-containing gas such as silane ($SiH_4$).

Furthermore, in various embodiments, during the fabrication, a flowrate ratio between the silicon-containing gas and the oxygen-containing gas varies in a step-gradient manner. For example, the flowrate ratio between $N_2O$ and $SiH_4$ can be provided in six steps and is increased from 0.8, 1.2, 1.5, 1.8, 2.5, and 4 to sequentially form the film. The process time in each step is not predetermined, and a film thermal stress S1 of the first inorganic layer is preferably between −10-10 MPa.

Furthermore, in various embodiments, the second inorganic layer has a thickness of 0.1-10 μm, and materials for fabricating the second inorganic layer may comprise SiNx, SiOxNy, SiOx, SiCNx, AlOx, or TiOx, but are not limited thereto, and methods for fabricating the second inorganic layer may comprise processes such as PECVD, ALD, PLD, or sputtering, but are not limited thereto. The film thermal stress S2 of the second inorganic layer is preferably less than −20 Mpa. Since there is a film thermal stress between the second inorganic layer and the first organic layer, so that the second inorganic layer is spontaneously formed with the wavy curved-configuration during fabrication, thereby causing the interface between the second inorganic layer and the first organic layer spontaneously becomes the continuous wavy curved-shape.

Furthermore, in various embodiments, the array unit layer comprises a buffer layer, a thin-film transistor (TFT) layer, a planarization layer, an anode, and a pixel definition layer, etc.

Furthermore, in various embodiments, the light-emitting device layer comprises a hole injection/transport layer, a light-emitting layer, and an electron injection/transport layer, etc.

Furthermore, another aspect of the present disclosure provides a fabrication method for fabricating the flexible OLED device as claimed in claim 1, comprising the following steps:

sequentially forming an array unit layer and a light emitting device layer over a substrate;

forming a first inorganic layer of an encapsulation layer over the light emitting device layer to encapsulate the light emitting device layer;

forming a first organic layer over the first inorganic layer to encapsulate the light emitting device layer, and the first inorganic layer exist outside side portions of the first organic layer; and forming a second inorganic layer over the first organic layer to encapsulate the first organic layer, connecting the first inorganic layer outside the side portions of the first organic layer, wherein there is a thermal stress difference between the fabricated first organic layer and the second inorganic layer, so that the second inorganic layer is spontaneously formed with a continuous wavy curved-configuration during fabrication thereof, thereby forming an interface of continuous wavy curved-shape between the second inorganic layer and the first organic layer.

Furthermore, in various embodiments, methods for fabricating the first inorganic layer may be processes such as plasma-enhanced chemical vapor deposition (PECVD), atomic layer deposition (ALD), pulsed laser deposition (PLD), or sputtering, but are not limited thereto.

Furthermore, in various embodiments, the first inorganic layer is fabricated by a PECVD process, and reaction gases for fabricating the first organic layer comprises at least one oxygen-containing gases such as oxygen, $N_2O$, and a silicon-containing gas such as silane ($SiH_4$).

Furthermore, in various embodiments, during the fabrication of the first organic layer, a flowrate ratio between the silicon-containing gas and the oxygen-containing gas varies in a step-gradient manner. For example, the flowrate ratio between $N_2O$ and $SiH_4$ can be provided in six steps and is increased from 0.8, 1.2, 1.5, 1.8, 2.5, and 4 to sequentially form the film. The process time in each step is not predetermined, and a film thermal stress S1 of the first inorganic layer is preferably between −10-10 MPa.

Furthermore, in various embodiments, methods for fabricating the second inorganic layer may comprise processes such as PECVD, ALD, PLD, or sputtering, but are not limited thereto. The film thermal stress S2 of the second inorganic layer is preferably less than −20 Mpa Since there is a film thermal stress between the second inorganic layer and the first organic layer, so that the second inorganic layer is spontaneously formed with the wavy curved-configuration during fabrication, thereby causing the interface between the second inorganic layer and the first organic layer spontaneously becomes the continuous wavy curved-shape.

Compared with the related art, benefits of the present application are directed to a flexible OLED device and a method for fabricating the same, wherein the outer inorganic layer of encapsulation layer of the flexible OLED device uses a curved configuration, so that the stress bore by the inorganic encapsulating layer at the bending place of the flexible OLED device can be reduced by its own structural configuration, while the curved surface shape thereof increases the contact area between the outer inorganic layer and the inner organic layer, thereby effectively reducing risks of breakage of the outer inorganic layer in the bending area.

Furthermore, the curved configuration of the outer inorganic layer and the wavy curved-configuration between the inner organic layer are formed by the thermal stress difference between the two layers is spontaneously formed during the fabrication process. There is no need for additional processing steps to form the curved-configuration during the fabrication process, thereby making the entire operating processes simple and easy.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

FIG. 1 is a structural schematic diagram of a flexible organic light-emitting diode (OLED) device according to an embodiment of the present application.

DETAILED DESCRIPTION

The following description of the various embodiments is provided to illustrate the specific embodiments of the flexible organic light-emitting diode (OLED) device and fabrication method thereof.

As shown in FIG. 1, an embodiment of the present disclosure provides a flexible OLED device, comprising a substrate 100, an array unit layer 200, a light-emitting device layer 300 and an encapsulation layer 400 that are sequentially disposed.

The array unit layer 200 comprises a buffer layer, a thin-film transistor (TFT) layer, a planarization layer, an anode, and a pixel definition layer, etc. The light-emitting device layer 300 comprises a hole injection/transport layer, a light-emitting layer, and an electron injection/transport layer, etc. The encapsulation layer 400 comprises a first inorganic layer 410, a first organic layer 420, and a second inorganic layer 430. An interface between the first organic layer 420 and the second inorganic layer 430 has a continuous wavy curved-shape.

In order to avoid unnecessary repetition, the flexible OLED device according to the present disclosure will be further described below in conjunction with the fabrication method of the flexible OLED device according to the present disclosure.

First, the array unit layer 200 and the light-emitting device layer 300 are fabricated over an OLED device substrate provided and known to the people in the art.

Next, the first inorganic layer 410 of the encapsulation layer 400 is fabricated over the light-emitting device layer 300 to entirely cover the light-emitting device layer 300, having a thickness of 0.1-10 µm. Materials for fabricating the first inorganic layer 410 may comprise SiNx, SiOxNy, SiOx, SiCNx, AlOx, or TiOx, but are not limited thereto. Methods for fabricating the first inorganic layer 410 may be processes such as plasma-enhanced chemical vapor deposition (PECVD), atomic layer deposition (ALD), pulsed laser deposition (PLD), or sputtering, but are not limited thereto.

Third, the first organic layer 420 is fabricated over the first inorganic layer 410, and the deposited first inorganic layer 420 entirely covers a light-emitting area of the light-emitting device layer 300 but not entirely covers the first inorganic layer 410, so that the first inorganic layer 410 is at both sides of the first inorganic layer 420, having a thickness of 1-100 µm. The first organic layer 420 comprises pp-HMDSO:F polymerized by fluorinated plasma polymerization, and can be fabricated by a PECVD process.

Furthermore, reaction gases related to the PECVD process for fabricating the first organic layer 420 comprises at least one oxygen-containing gases such as oxygen, $N_2O$, and a silicon-containing gas such as silane ($SiH_4$). During the fabrication, a flowrate ratio between the silicon-containing gas and the oxygen-containing gas varies in a step-gradient manner. For example, the flowrate ratio between $N_2O$ and $SiH_4$ can be provided in six steps and is increased from 0.8, 1.2, 1.5, 1.8, 2.5, and 4 to sequentially form the film. The process time in each step is not predetermined, and a film thermal stress S1 of the first inorganic layer 420 is preferably between −10-10 MPa.

Fourth, the second inorganic layer 430 is fabricated over the first organic layer 420 to entirely cover the light-emitting device layer and the first inorganic layer 420, and connects two ends of the first inorganic layer 410 outside the first inorganic layer, having a thickness of 0.1-10 µm. Materials for fabricating the second inorganic layer 430 may comprise SiNx, SiOxNy, SiOx, SiCNx, AlOx, or TiOx, but are not limited thereto. Methods for fabricating the second inorganic layer 430 may comprise processes such as PECVD, ALD, PLD, or sputtering, but are not limited thereto.

Preferably, the film thermal stress S2 of the second inorganic layer is less than −20 Mpa. Furthermore, since there is a film thermal stress between the second inorganic layer 430 and the first organic layer 420, so that the second inorganic layer 430 is spontaneously formed with the wavy curved-configuration during fabrication, thereby causing the interface between the second inorganic layer 430 and the first organic layer 420 spontaneously becomes the continuous wavy curved-shape and no additional operation is needed during fabrication thereof.

Last, an optical clear adhesive (OCA) layer is coated over the second inorganic layer 430 to level recesses over the of the continuous wavy curved-shape top surface formed due to the difference existing between the film thermal stresses of the second inorganic layer 430 and the first organic layer 420. After coverage of the OCA layer, the OCA layer is formed with a planar surface configuration for the convenience of bonding of the overlying module.

Furthermore, the encapsulation layer 400 related to the present disclosure is a three-layered structure, but is not thereto. The process steps may be repeated for 2-4 steps to obtain a thin film encapsulation structure having various layered structure. The layer of the stacked structure can be adjusted according to the requirement, but is not thus limited.

The present disclosure is directed to a flexible OLED device and a method for fabricating the same, wherein the outer inorganic layer of encapsulation layer of the flexible OLED device uses a curved configuration, so that the stress bore by the inorganic encapsulating layer at the bending place of the flexible OLED device can be reduced by its own structural configuration, while the curved surface shape thereof increases the contact area between the outer inorganic layer and the inner organic layer, thereby effectively reducing risks of breakage of the outer inorganic layer in the bending area.

Furthermore, the curved configuration of the outer inorganic layer and the wavy curved-configuration between the inner organic layer are formed by the thermal stress difference between the two layers is spontaneously formed during the fabrication process. There is no need for additional processing steps to form the curved configuration during the fabrication process, thereby making the entire operating processes simple and easy.

What is claimed is:

1. A flexible organic light emitting diode (OLED) device, comprising a substrate, an array unit layer, a light-emitting device layer, and an encapsulation layer that are sequentially disposed, wherein:
    the encapsulation layer comprises a first inorganic layer, a first organic layer and a second inorganic layer that are sequentially disposed;
    the first inorganic layer encapsulates the light emitting device layer and connects the array unit layer at two ends thereof;
    the first organic layer is disposed over the first inorganic layer to encapsulate the light emitting device layer in the same way;
    the second inorganic layer encapsulates the first organic layer and connects two ends of the first organic layer outside the first organic layer; and
    the second inorganic layer has a continuous wavy curved-configuration, and an interface between the second inorganic layer and the first organic layer has a continuous wavy curved-shape, wherein:
    the first inorganic layer has a thickness of 0.1-10 µm;
    the first organic layer has a thickness of 1-100 µm; and
    the second inorganic layer has a thickness of 0.1-10 µm.

2. The flexible OLED device as claimed in claim 1, wherein:
    there is a thermal stress difference between a film thermal stress of the first organic layer and a film thermal stress of the second inorganic layer; and
    the second inorganic layer is spontaneously formed with the curved configuration during fabrication thereof due to the existence of the thermal stress difference between the first organic layer and the second inorganic layer, thereby causing the interface between the second inorganic layer and the first organic layer is spontaneously formed with the continuous wavy curved-shape.

3. The flexible OLED device as claimed in claim 2, wherein the film thermal stress of the first organic layer is greater than the film thermal stress of the second inorganic layer.

4. The flexible OLED device as claimed in claim 2, wherein the film thermal stress of the first organic layer is between −10-10 MPa.

5. The flexible OLED device as claimed in claim 2, wherein the film thermal stress of the second inorganic layer is less than −20 MPa.

6. The flexible OLED device as claimed in claim 1, wherein:
   the encapsulation layer further comprises a second organic layer and a third inorganic layer disposed over the second inorganic layer; and
   the third inorganic layer has a curved configuration, and an interface between the third inorganic layer and the second organic layer is a continuous wavy curved-shape.

7. The flexible OLED device as claimed in claim 1, wherein an optically clear adhesive (OCA) layer is disposed over the second inorganic layer to level the continuous wavy curved-configuration of the second inorganic layer.

8. A fabrication method for fabricating the flexible OLED device as claimed in claim 1, comprising the following steps:
   sequentially forming an array unit layer and a light emitting device layer over a substrate;
   forming a first inorganic layer of an encapsulation layer over the light emitting device layer to encapsulate the light emitting device layer;
   forming a first organic layer over the first inorganic layer to encapsulate the light emitting device layer, and the first inorganic layer exist outside side portions of the first organic layer; and
   forming a second inorganic layer over the first organic layer to encapsulate the first organic layer, connecting the first inorganic layer outside the side portions of the first organic layer,
   wherein a thermal stress difference exists between the fabricated first organic layer and the second inorganic layer, so that the second inorganic layer is spontaneously formed with a continuous wavy curved-configuration during fabrication thereof, thereby forming an interface of continuous wavy curved-shape between the second inorganic layer and the first organic layer.

9. The fabrication method for fabricating the flexible OLED device as claimed in claim 8, wherein:
   the first organic layer is formed by a plasma-enhanced chemical vapor deposition (PECVD) process; and
   reacting gases comprises an oxygen-containing gas and a silicon-containing gas; and
   a gas flow ratio between the silicon-containing gas and the oxygen-containing gas varies in a step-gradient manner.

* * * * *